United States Patent
Kim (10) Patent No.: US 8,680,523 B2
(45) Date of Patent: Mar. 25, 2014

(54) SENSOR FOR SEMICONDUCTOR DEGRADATION MONITORING AND MODELING

(75) Inventor: Moon J. Kim, Wappingers Falls, NY (US)

(73) Assignee: IP Cube Partners (ICP) Co., Ltd., Seoul (KR)

( * ) Notice: Subject to any disclaimer, the term of this patent is extended or adjusted under 35 U.S.C. 154(b) by 222 days.

(21) Appl. No.: 12/969,636

(22) Filed: Dec. 16, 2010

(65) Prior Publication Data

US 2012/0153279 A1 Jun. 21, 2012

(51) Int. Cl.
*H01L 23/58* (2006.01)
*H01L 21/66* (2006.01)

(52) U.S. Cl.
USPC .............................................. 257/48; 438/11

(58) Field of Classification Search
CPC ................. H01L 23/58; H01L 21/66
USPC ................ 257/48, E21.531, E23.002; 438/11
See application file for complete search history.

(56) References Cited

U.S. PATENT DOCUMENTS

| | | |
|---|---|---|
| 4,520,448 A | 5/1985 | Tremintin |
| 6,414,508 B1 | 7/2002 | London |
| 6,662,142 B2 | 12/2003 | Shiba |
| 6,903,564 B1 | 6/2005 | Suzuki |
| 7,054,787 B2 | 5/2006 | Gauthier et al. |
| 7,283,919 B2 | 10/2007 | Gross et al. |
| 7,307,328 B2 | 12/2007 | Meyer et al. |
| 7,340,359 B2 | 3/2008 | Erez et al. |
| 7,495,519 B2 | 2/2009 | Kim et al. |
| 7,592,876 B2 | 9/2009 | Newman |
| 2003/0020131 A1* | 1/2003 | Asam et al. .................... 257/467 |
| 2006/0049886 A1 | 3/2006 | Agostinelli, Jr. et al. |
| 2009/0237103 A1 | 9/2009 | Ellis-Monaghan et al. |
| 2010/0109005 A1 | 5/2010 | Grillberger et al. |
| 2012/0034713 A1* | 2/2012 | Lee ................................. 438/5 |

* cited by examiner

*Primary Examiner* — Walter H Swanson
(74) *Attorney, Agent, or Firm* — Maxine L. Barasch; Keohane & D'Alessandro, PLLC (57) ABSTRACT

The present invention provides in-situ positioning of a sensor within each functional block, as well as at critical locations, of a semiconductor system. Sensor quantity and location is optimized for maximum sensitivity to known process variations. The sensor models a behavior of the location in which it is positioned and comprises a plurality of stages connected as a network and a self-digitizer. Each sensor has a mode selection input for selecting a mode thereof and an operational trigger input for enabling the sensor to model the behavior. The model selection input and operation trigger enable the sensor to have an operational mode in which the plurality of sensors are subject to an aging process, as well as a measurement mode in which an age of the plurality of sensors is outputted. Based on the output, one or more functional blocks are modified to reduce semiconductor system gradation in real-time.

8 Claims, 11 Drawing Sheets

SEMICONDUCTOR FAB

WAFER TEST

CHIP TEST

Specifications:
System clock frequency
Power consumption

SENSOR FOR SEMICONDUCTOR DEGRADATION MONITORING AND MODELING

TECHNICAL FIELD

The present invention relates to sensor technology. Specifically, the present invention relates to a reliability sensor timing method, and the in-situ positioning/assimilation of reliability sensors within functional blocks and critical locations of a semiconductor system.

BACKGROUND OF THE INVENTION

Advancement in semiconductor technology is often limited by semiconductors' limited life span. Specifically, a semiconductor system suffers from gradual or abrupt failures due to aging. Along these lines, accumulated quantum mechanical effects cause semiconductor device failure even under nominal operation conditions. Such failure dramatically degrades system performance and reliability. Previous approaches provide estimated life span only. That is, previous approaches attempt to predict the reliability of device technology and publish it as a specification. Such an approach, however, is not useful to measure individual chip aging since: it does not experience circuit switching behaviors; it does not imitate system operation pattern in practice; and it requires high precision data converters.

The following previous attempts have been made:

U.S. Pat. No. 7,592,876—This patent discloses a method for monitoring the age of a target circuit component in a semiconductor device by using at least one aging leakage oscillator and a reference leakage oscillator. The aging oscillator is stressed whenever the target circuit component is used while the reference oscillator is not.

U.S. Pat. No. 7,495,519—This patent discloses a system and method for monitoring reliability of a digital system and for issuing a warning signal if the digital system operation degrades past a specific threshold. The technique utilizes a ring oscillator sensor in association with the digital system, wherein logic and/or device percent composition of the ring oscillator sensor mirrors percent composition thereof within the digital system.

U.S. Pat. No. 7,307,328—This patent discloses a semiconductor body in which is integrated a temperature sensor for measuring the temperature in the semiconductor body. Reducing the amount or occurrence of thermal damage to a semiconductor device is the object of this invention.

U.S. Pat. No. 7,283,919—This patent discloses a system that tests the quality and/or the reliability of a component by applying test conditions to a plurality of specimens of the component during operation.

U.S. Pat. No. 6,662,142—This patent discloses a system for providing information on quality and reliability of optical semiconductor devices by using a communications network.

U.S. Patent Application 20060049886—This patent application discloses an on-die record-of-age circuit which includes a reference oscillator circuit, an aging oscillator circuit, and a frequency comparator.

U.S. Pat. No. 7,340,359—This patent discloses a method for augmenting quality or reliability of semiconductor units, including providing semiconductor units that are subject to quality or reliability testing.

U.S. Pat. No. 6,414,508—This patent discloses a method for predicting reliability of semiconductor devices and wafers without a lengthy burn-in process. A set of electrical tests are performed before and after stressing each of the semiconductor devices with an elevated voltage above normal operating voltage for the semiconductor device.

U.S. Pat. No. 4,520,448—This patent discloses a method of characterizing reliability in bipolar semiconductor devices. A reliability function is determined as a function of the interface charge density, the oxide charge density, and the impurity concentration in the epitaxial silicon layer and is correlated with a time-to-fail.

U.S. Patent Application 20100109005—This patent application discloses a semiconductor device from which electrical measurement data may be obtained for enhanced spatial resolution by providing a distributed sensor structure.

U.S. Patent Application 20090237103—This patent application discloses a semiconductor die including a semiconductor chip and a test structure located in a scribe area.

However, none of these previous attempts provide an accurate way to truly model the age of semiconductors and/or functional blocks thereof. In view of the foregoing, there exists a need for a solution that solves one or more of the deficiencies of the related art.

SUMMARY OF THE INVENTION

In general, embodiments of the present invention provide a semiconductor sensor reliability system and method. Specifically, the present invention provides in-situ positioning of a reliability sensor (hereinafter sensors) within each functional block, as well as at critical locations, of a semiconductor system. The quantity and location of the sensors are optimized to have maximum sensitivity to known process variations. In general, the sensor models a behavior (e.g., aging process) of the location (e.g., functional block) in which it is positioned and comprises a plurality of stages connected as a network and a self-digitizer. Each sensor has a mode selection input for selecting a mode thereof and an operational trigger input for enabling the sensor to model the behavior. The model selection input and operation trigger enable the sensor to have an operational mode in which the plurality of sensors are subject to an aging process, as well as a measurement mode in which an age of the plurality of sensors is outputted. Based on the output, one or more functional blocks are modified by a control sensor component to reduce semiconductor system degradation in real-time.

A first aspect of the present invention provides a semiconductor sensor reliability system, comprising: a semiconductor system comprising a plurality of functional blocks; a plurality of sensors positioned on the plurality of functional blocks, wherein each of the plurality of functional blocks has at least one sensor, and wherein each of the plurality of sensors models a behavior of the location in which it is positioned; and a sensor control component for controlling the plurality of sensors based on an output received from the plurality of sensors.

A second aspect of the invention provides is a system for semiconductor sensor reliability operation. In this approach, the system comprises at least one processing unit, and memory operably associated with the at least one processing unit. A sensor control component is storable in memory and executable by the at least one processing unit. The sensor control component is configured to: receive an output from a plurality of sensors positioned on a plurality of functional blocks of a semiconductor system, wherein each of the plurality of functional blocks has at least one sensor, and wherein the output models an aging process of the location in which it is positioned; and modify at least one of the following: at least one of the plurality of sensors, at least one of the plurality of functional blocks, and the semiconductor system.

A third aspect of the present invention provides a method for sensing semiconductor reliability operation, comprising: positioning a plurality of sensors on a plurality of functional blocks to observe defect-sensitive locations within a semiconductor system, wherein each of the plurality of functional blocks has at least one sensor; and engaging an operational model of the plurality of the sensors to cause each sensor to output a model representing an aging process of the defect-sensitive location in which it is positioned; and modifying at least one of the following based on the outputted model: at least one of the plurality of sensors, at least one of the plurality of functional blocks, and the semiconductor system.

BRIEF DESCRIPTION OF THE DRAWINGS

These and other features of this invention will be more readily understood from the following detailed description of the various aspects of the invention taken in conjunction with the accompanying drawings in which.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

Illustrative embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," or similar language means that a particular feature, structure, or characteristic described in connection with the embodiment is included in at least one embodiment of the present invention. Thus appearances of the phrases "in one embodiment," "in an embodiment," "in embodiments" and similar language throughout this specification may, but do not necessarily, all refer to the same embodiment.

As indicated above, embodiments of the present invention provide a semiconductor sensor reliability system and method. Specifically, the present invention provides in-situ positioning of a reliability sensor (hereinafter sensors) within each functional block, as well as at critical locations, of a semiconductor system. The quantity and location of the sensors are optimized to have maximum sensitivity to known process variations. In general, the sensor models a behavior (e.g., aging process) of the location (e.g., functional block) in which it is positioned and comprises a plurality of stages connected as a network and a self-digitizer. Each sensor has a mode selection input for selecting a mode thereof and an operational trigger input for enabling the sensor to model the behavior. The model selection input and operation trigger enable the sensor to have an operational mode in which the plurality of sensors are subject to an aging process, as well as a measurement mode in which an age of the plurality of sensors is outputted. Based on the output, one or more functional blocks are modified by a control sensor component to reduce semiconductor system degredation in real-time.

Figure 1:
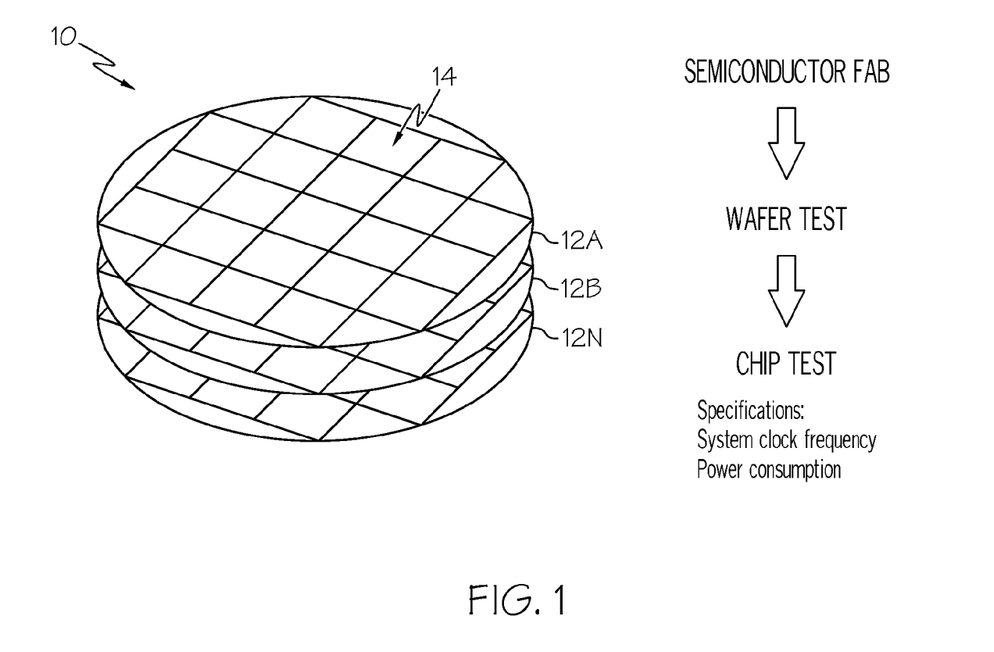
FIG. 1 depicts a semiconductor system according to an aspect of the present invention.

Referring now to FIG. 1, a semiconductor fabrication process is shown. As depicted, semiconductor 10 can include one or more wafer/layer 12A-N, each of which has various functional blocks 14. During or after the process, semiconductor 10 will undergo a series of tests for functionality. As shown, such tests can include a wafer level test, and a chip test. Under a chip test, various characteristics/functions such as system clock frequency, power consumption, etc. will be tested.

Figure 2:
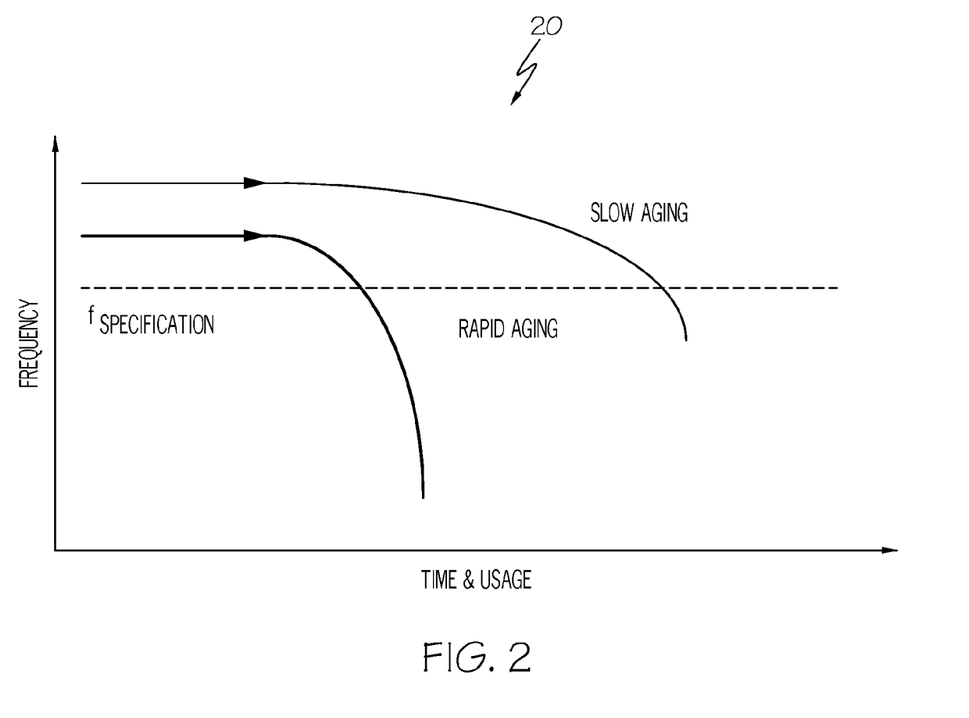
FIG. 2 depicts a graph of frequency versus time and usage of a typical semiconductor system according to an aspect of the present invention.
Figure 3A:
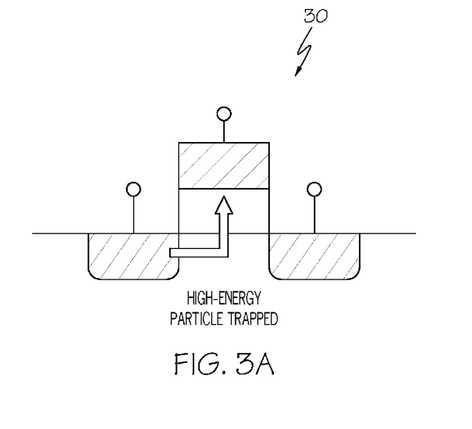
FIG. 3 depicts typical defects caused by degradation of a semiconductor system according to an aspect of the present invention.
Figure 3B:
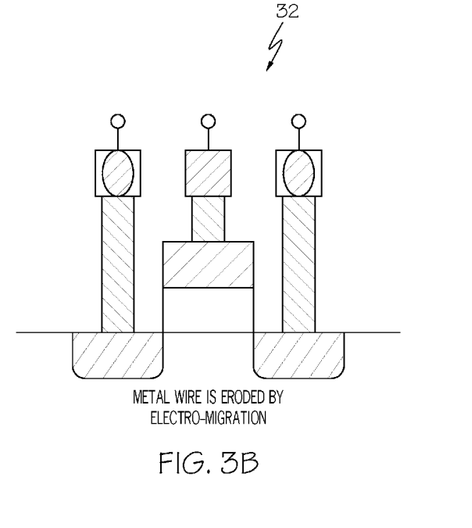

As indicated above, however, as a semiconductor (system) ages, degradation in performance is observed. For example, referring now to FIG. 2, a graph 20 of frequency versus time and usage is depicted. As shown, as a semiconductor is used over time, frequency decreases. That is, frequency on which the semiconductor can operate nominally decreases and then the semiconductor may malfunction (e.g. the semiconductor or corresponding functional blocks in the semiconductor give wrong output) at f_SPECIFICATION which the semiconductor manufacturer guarantees as its specification. This effect is especially profound where rapid aging of the semiconductor occurs. The physical effects are more clearly depicted in FIG. 3. As shown in device 30, a high-energy particle becomes trapped. Moreover, as shown in device 32, metal wire is eroded by electro-migration. Along these lines, transistors become slower and weaker with aging.

As such, the need to monitor and detect age-based degradation is ever growing. This is especially the case given the trends towards increasing complexity, technology scaling, technology integration, and application layer advancements. Moreover, there is a need for higher-level reliability across the system hierarchy, as well as a need to identify and isolate the most likely runtime component failure to avoid catastrophic system failure.

Figure 4:
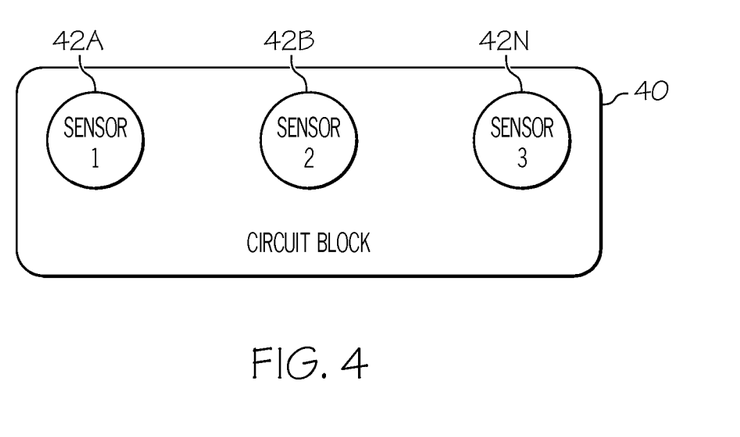
FIG. 4 depicts a circuit block having different sensors according to an aspect of the present invention.

Referring now to FIG. 4, a circuit block 40 having sensors 42A-N (e.g., age-detecting sensors) is shown. In general, sensors 42A-N collect, process, and store sensed data and can communicate in a network fashion. Along these lines, sensors 42A-N are configured to model the behavior of the functional block in which they are positioned. This allows sensors 42A-N to age along with the functional blocks in which they are respectively positioned. In general, sensors 42A-N are circuit-based, self-digitizing, in-situ, are assimilated into system operation, operate and report in real-time, have measurement and operation modes, and have an aging sensitivity adjustment so that they can accurately model their functional blocks. In addition, sensors 42A-N are differentiated from one another based upon sensing range and timing. Moreover, sensors 42A-N are tailored to have a maximum sensitivity along the several steps of block reliability degradation. The use of sensors 42A-N in accordance with the embodiments recited herein allow for preemptive action, as well as computation of average failure data and end-of-life estimations.

Figure 5:
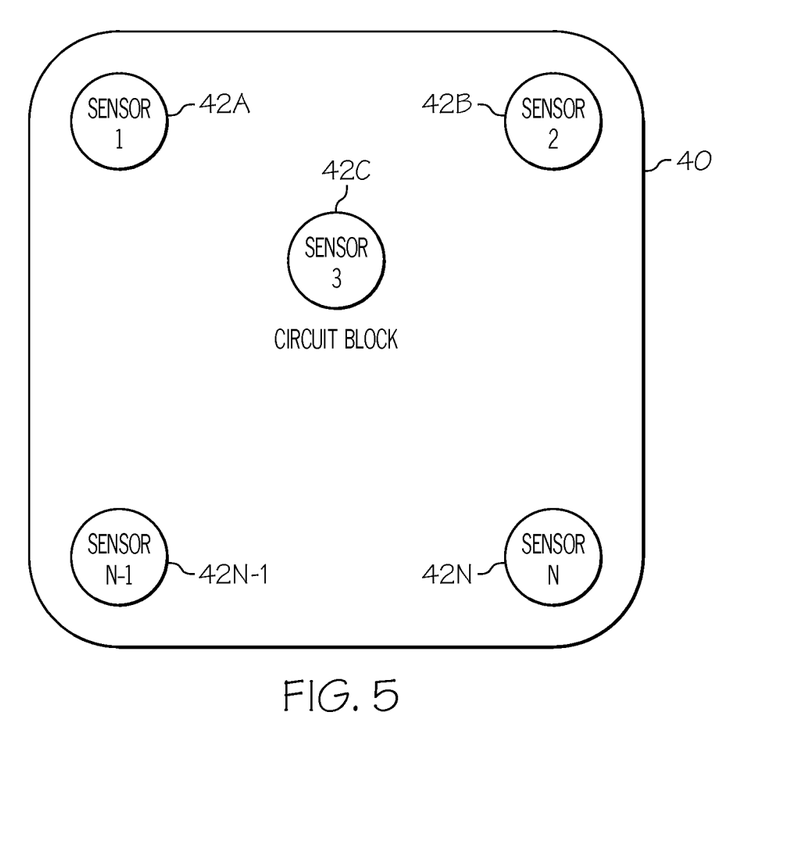
FIG. 5 depicts a circuit block having sensors positioned in various locations according to an aspect of the present invention.

Referring now to FIG. 5, circuit block 40 according to another embodiment is shown. Here, multiple sensors 42A-N positioned at various locations are used to monitor circuit block 40. Sensors 42A-N are positioned at locations within circuit block 40 subject to semiconductor system manufacturing process variation. Sensors 42A-N collect, process, and store sensed data about both predicted and unpredicted semiconductor degradation. Sensor placement is optimized based on the estimated physical effects inherent with the semiconductor fabrication process, as well as the estimated manufacturing physical effects beyond the semiconductor system. Sensors 42A-N are also differentiated from one another based upon sensing range and timing. Along these lines, sensors 42A-N are tailored to have a maximum sensitivity at each location. The use of sensors 42A-N in accordance with the embodiments recited herein allow for preemptive action, as well as computation of average failure data and end-of-life estimations at various locations within circuit block 40.

Figure 6:
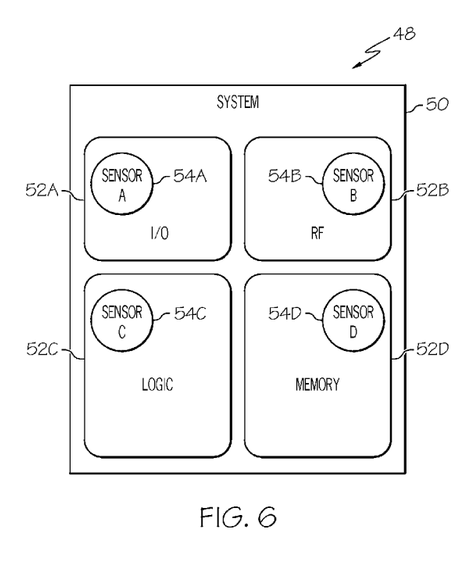
FIG. 6 depicts sensors positioned within functional blocks of a semiconductor system according to an aspect of the present invention.

Referring now to FIG. 6, a semiconductor sensor reliability system 48 is shown. As depicted, system 48 comprises a semiconductor system 50 having functional blocks 52A-D. Positioned on/in each functional block 52A-D is a sensor 54A-D (e.g., shown as sensors 42A-N in FIG. 4). As mentioned above, each sensor 54A-D is designed to model a behavior of the functional block 52A-D in which it is positioned. Along these lines, since each functional block 52A-D can have different operating conditions and components, each sensor 54A-D will as well, since they are configured to adopt the operating conditions (i.e., an aging process) of their respective functional blocks 52A-D. Specifically, each sensor 54A-D is configured to have performance characteristics matching their respective functional block 52A-D. Such characteristics can include speed of operation (oscillations/unit of time), frequency, etc. This allows each sensor 54A-D to age in a fashion similar or identical to its respective functional block 52A-N. Further, in a typical embodiment, sensors 54A-D are electrically/electronically coupled to functional blocks 52A-D to allow them to sense the performance characteristics thereof. Along these lines, sensors 54A-D will be able to detect when the functional blocks are slowing down and/or failing. As sensors 54A-D are operating, they sense and/or record the performance characteristic of functional blocks 54A-D. At each measured interval, sensors 54A-D can also note and/or output its age. This allows for an age versus performance table or the like to be created.

Figure 7:
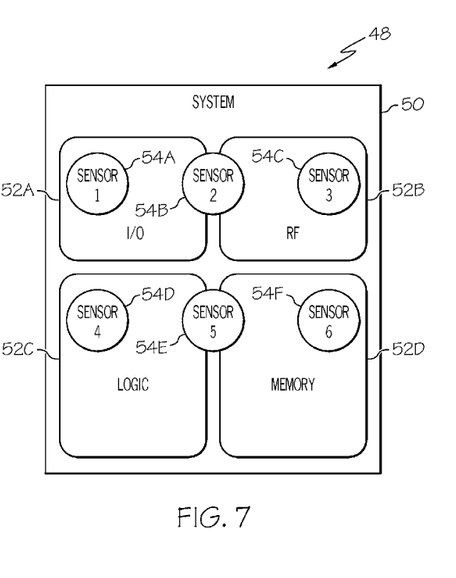
FIG. 7 depicts sensors positioned at defect-sensitive locations within the semiconductor system according to an aspect of the present invention.

Referring now to FIG. 7, semiconductor sensor reliability system 48 according to another embodiment of the invention is shown. As depicted, a plurality of sensors 54A-F are positioned on plurality of functional blocks 52A-52D to observe defect-sensitive locations within system 48, wherein each of plurality of functional blocks 52A-52D has at least one sensor. In this embodiment, the defect-sensitive location comprises at least one of the following: a location within functional blocks 52A-52D subject to semiconductor system 48 manufacturing process variation, and a connection point between functional blocks 52A-52D. As mentioned above sensors 54A-F collect, process, and store sensed data about both predicted and unpredicted semiconductor degradation. Each sensor 54A-F is designed to model a behavior of the location in which it is positioned. As configured, sensors 54B and 54E adopt the operating conditions (i.e., an aging process) of the locations in which they are located. Specifically, each sensor 54B and 54E (e.g., each a gradient-detecting sensor) is configured to have performance characteristics matching their respective connection points between functional blocks. For example, sensors located between functional blocks may observe the gradient that occurs between two functional blocks. In this case, the boundary between memory 52D and logic 52C would show difference process variation and aging artifacts, which comes from the lithographic limits and gate perimeter density. Typically, memory 52D is high, while logic 52C and others tend to be lower. Such variations can be characterised in terms of speed of operation (oscillations/unit of time), frequency, etc. This allows each sensor 54B-F to age in a fashion similar or identical to its respective connection point. The number and location of sensors 54A-F are optimized to have maximum sensitivity to known manufacturing process variation.

Further, in a typical embodiment, sensors 54A-F are electrically/electronically coupled, respectively, to functional blocks 52A-D and/or connection points between functional blocks 52A-52D to allow them to sense the performance characteristics thereof. Along these lines, sensors 54A-F will be able to detect when the observed locations are slowing down and/or failing. As sensors 54A-F are operating, they sense and/or record the performance characteristic of functional blocks 52A-D and their connection points. At each measured interval, sensors 54A-F can also note and/or output its age. This allows for an age versus performance table or the like to be created.

It is understood that sensors 54A-F can be "imbedded" within and/or between functional blocks 52A-D using any approach now known or later developed. For example, sensors can be coupled to functional blocks 52A-D via a processor or the like. Unlike previous approaches such as U.S. Pat. No. 7,054,787, each functional block 52A-D is "fitted" with one or more sensors. Moreover, each sensor 54A-F is individually configured to model its respective location within sensor reliability system 48 (e.g., in terms of performance characteristics, aging process, etc.).

Figure 8:
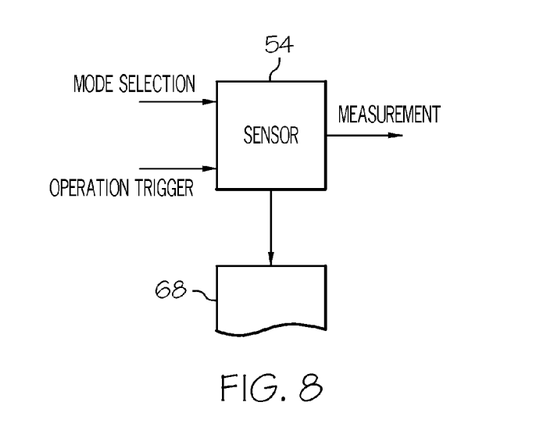
FIG. 8 depicts input and output for a sensor according to an aspect of the present invention.

Referring now to FIG. 8 a sensor 54 according to the present invention is shown. As depicted, sensor 54 has multiple inputs and an output. The inputs generally comprise a mode selection input for selecting a mode of sensors 54A-F (FIG. 7) and an operational trigger input for enabling sensors 54A-F to model the behavior (e.g., the aging process) of functional blocks 52A-D and the connection points therebetween. The modes generally comprise an operational mode in which sensors 54A-F are subject to that same operational conditions of their respective locations (e.g., an aging process) and a measurement mode in which an age of sensors 54A-F are outputted as a measurement. As indicated above, a sensor can also be configured to write to a table 68, for example, so that a record of age versus performance can be kept. This will allow for data mining, and for an examination of performance lifecycle of functional blocks 52A-D and/or sensors 54A-F.

Figure 9:
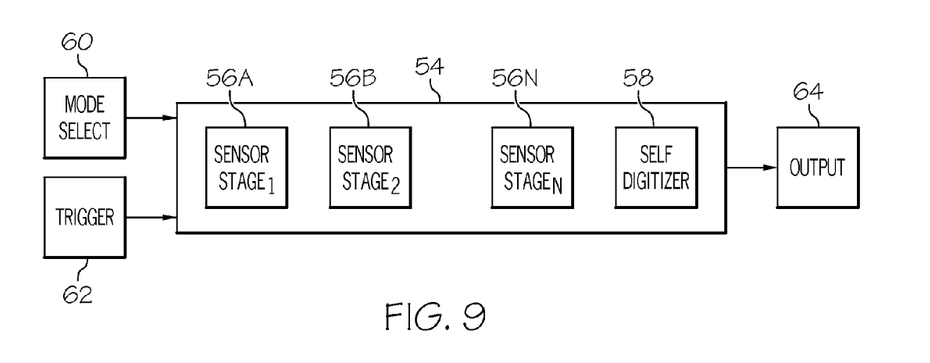
FIG. 9 depicts a more detailed diagram of a sensor according to an aspect of the present invention.

Referring now to FIG. 9, a more detailed diagram of sensor 54 is shown. It is understood that each sensor 54A-F will have the same or similar configuration to that shown in FIG. 8. Regardless, as depicted, sensor 54 comprises multiple sensor stages/blocks 56A-N and a self digitizer 58, which is a functional block of a network of the sensor stages 56A-N. As further shown, sensor 54 receives mode select input 60 and operational trigger input 62 (as described above).

Figure 10A:
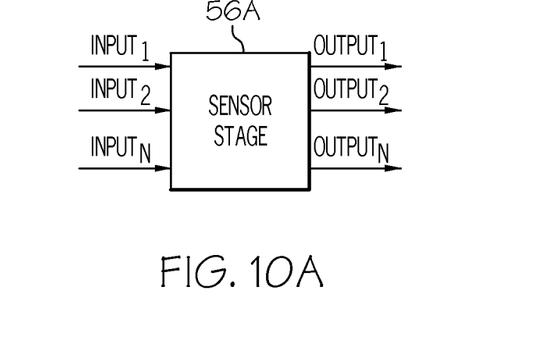
FIGS. 10A-10B depict a Complimentary Metal-Oxide Semiconductor (CMOS)-like configuration for a sensor stage according to an aspect of the present invention.
Figure 10B:
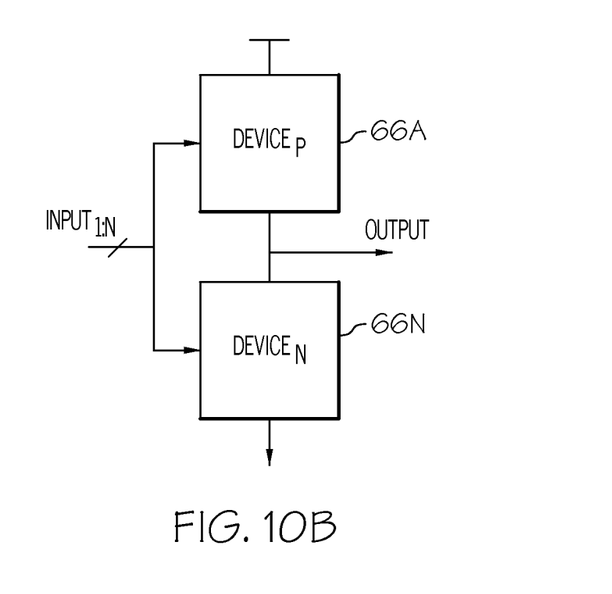
Figure 11A:
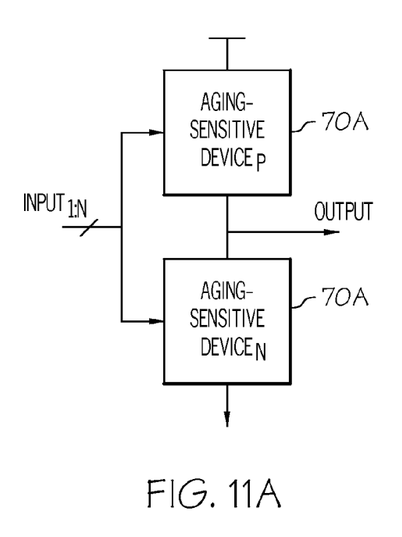
FIGS. 11A-11D depict aging-resistive and aging-sensitive devices that comprise a typical sensor stage according to an aspect of the present invention.
Figure 11B:
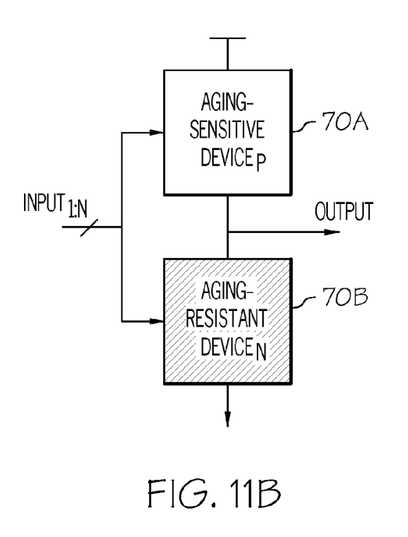
Figure 11C:
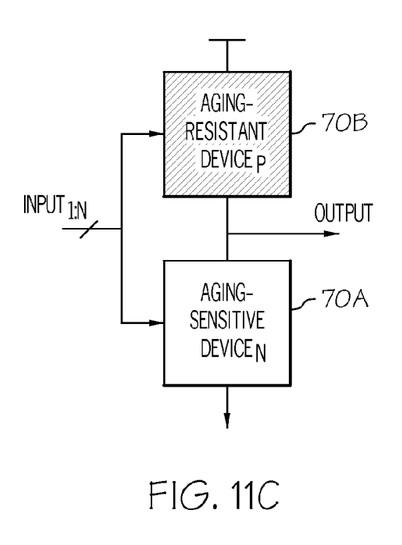
Figure 11D:
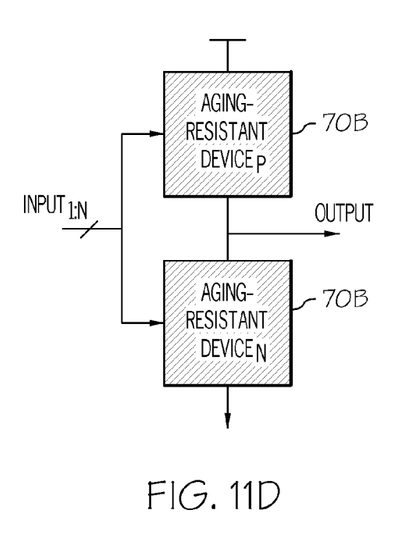

Along these lines, as shown in FIG. 10A, each sensor stage 56 has multiple inputs and outputs. Moreover, each sensor stage 56 has a CMOS-like stage configuration, which renders each state useful as a sensor stage for CMOS technology-based system monitoring. Moreover, each stage typically comprises multiple devices 66A-N, as shown in FIG. 10B. These devices 66A-N are selected to achieve desired sensor characteristics. For example, when a sensor device needs to simulate the monitored system, its simulation is closest to the monitor when the device is the same as the monitored system device. Selective device aging exposure is enabled when a nominal device and an aging-resistant device are used at the same time. As such, stage 56 can have fully sensing or non-sensing devices, and can share the same VDD and GND as the monitored system. It is noted, however, that not all stages necessarily have the same power supply.

Potential device configurations of sensor stages are shown in FIGS. 11A-D. As depicted, it is each sensory stage 56A-N (FIG. 9) comprises multiple devices configured in a CMOS-like fashion/configuration. Such devices typically are a combination of aging-sensitive devices 70A and/or aging-resistive devices 70B.

Figure 12A:
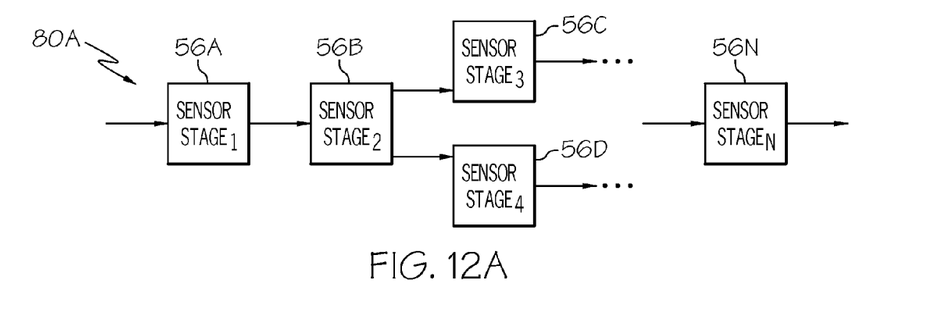
FIGS. 12A-12C depict network diagrams for sensor stages according to an aspect of the present invention.
Figure 12B:
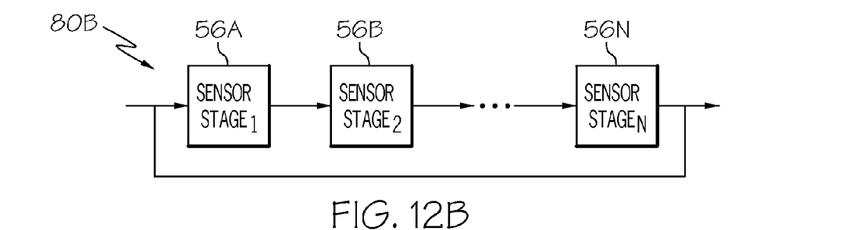
Figure 12C:
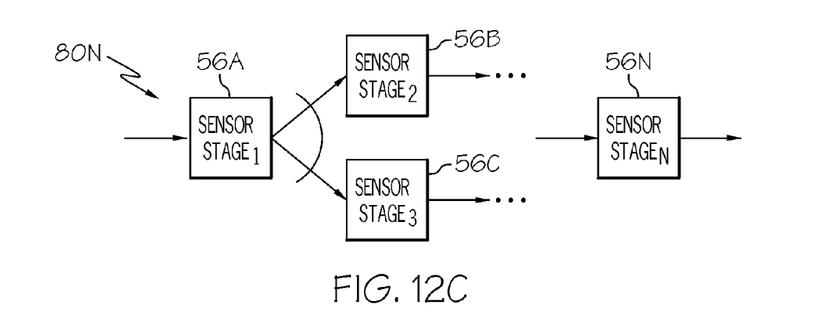

Referring now to FIG. 12, illustrative network configurations 80A-N of network stages 56A-N are shown in greater detail. Along these lines, it is apparent that sensor stages 56A-N not only are connected as a network, but that the network can be reconfigured (configurations 80A-N) to have different sensing effects. The network can be configured to determine maximally sensitive locations for multiple sensors across the system. Moreover, the number of stages 56A-N can determine the sensor system aging sensitivity. Still yet, the presence of more aging-sensitive sensing devices, as well as the location of the devices, is optimized to increase overall sensor sensitivity. The network of sensors can be organized to have effective digitizing functions wherein the number and location of sensors can determine the digitizer configuration. For example, a dedicated digitizer can be implemented in the system.

Figure 13:
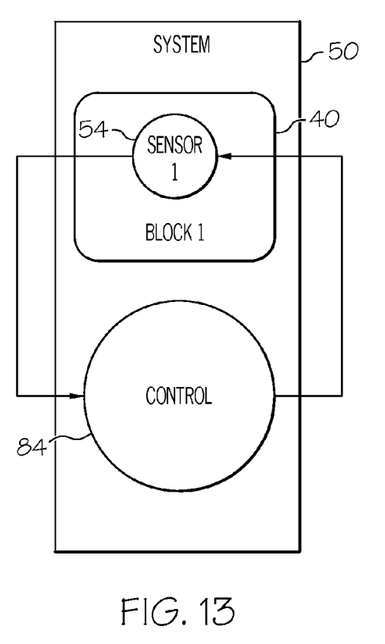
FIG. 13 depicts a sensor control component for controlling sensors according to an aspect of the present invention.

Referring now to FIG. 13, a method for semiconductor reliability sensor operation according to embodiments of the invention is shown. As discussed above, a plurality of sensors 54 is positioned on a plurality of functional blocks 52 to observe defect-sensitive locations within semiconductor system 50. Each of the plurality of functional blocks 52 has at least one sensor 54, which imitates operation behavior of functional block 52. To accomplish this, an operational model of sensor 54 is engaged to cause each sensor 54 to output a model representing the aging process of the defect-sensitive location in which it is positioned. Based on the outputted model, a sensor control component 84 modifies at least one of the following: sensor 40, functional block 40, and system 50. Sensor control may be designed in hardware, firmware, operating system (OS), application, etc., and may be part of system 50, as shown, or an external component in communication with system 50. In one embodiment, sensor control component 84 is configured to monitor functional block 52 and system 50 activity, and enforce sensor assimilation to block and sensor operation modes. That is, sensor control component 84 selects a mode of sensor 54 and an operational trigger input for enabling sensors 54 to model the behavior (e.g., the aging process) of functional blocks 52 and the connection points therebetween. The modes generally comprise an operational mode in which sensors 54 are subject to that same operational conditions of their respective locations (e.g., an aging process) and a measurement mode in which an age of sensors 54 are outputted as a measurement.

Figure 14:
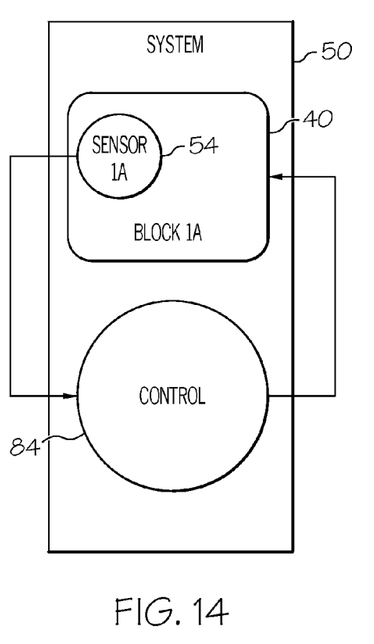
FIG. 14 depicts a sensor control component for controlling a circuit block according to an aspect of the invention.

As shown in FIG. 14, sensor control component 84 is configured to receive sensor 54 output to control functional block 52 ("Block 1A") and/or system 50 based on the output. Sensor control component 84 determines the status (e.g., level of degradation) of functional block 52, and translates the status to formulate a sensor operation policy to better observe and delay the aging process for functional block 52. Sensor operation policy can be adjusted in real-time based on the block operation status observed by sensor 54. That is, each sensor can adjust it's mode depending on the block operation status, such as sleep mode, low-power, or high-performance mode, etc. A sensor can save system power by not operating during low-power mode, though the duration of low-power mode can still be accounted. The sensor can take on more aging (to compensate the low-power mode) by allowing more aging during the high-performance mode (especially when it is getting charged, etc.) There are several ways to account for the low-power mode duration. In one embodiment, voltage, clock frequency, duration, chip temperature, amount of data processed, etc., are used to calculate or estimate the aging that occurred. The equivalent amount can be compensated later during the high-performance mode. Alternatively, Furthermore, sensor control component 84 may intervene system operation based on the output from sensor 54, and adjust system 50 operation condition accordingly. That is, system 50 may be changed by adjusting clock frequency, voltage, instructions allowed, blocks engaged, temperature allowed, duration of CPU duty cycle (loading/full capacity), etc. For example, sensor control component can isolate suspicious blocks from operation, such as a bank of cache, a core, a data bus, etc. In the case of a multi-core processor, sensor control component may detect that the core is getting aged dose to a critical threshold. To address this, the core can be utilized with redundancy and an extra check-up. Also the core can be set to limit a maximum load, clock frequency, voltage etc. These variables can be lowered as the aging move close to failure. When the sensor detects imminent failure, the sensor control component can pull out instructions and system status to other cores (or memory, HDD) using virtualization. A design-choice can set multiple-levels of warning raised by sensors, and corresponding operation policies consisting of combinations of system operation conditions. This multi-level, reliability-aware policy enables continuous system transition by modifying sensor behavior and system operation to reduce semiconductor system degredation in real-time.

In communicating in a network capacity, it is understood that any type of network can be implemented hereunder. Examples include a local area network (LAN), a general wide area network (WAN), etc. Along these lines, network adapters also may be coupled to the system to enable the data processing system to become coupled to other data processing systems, remote printers, storage devices, and/or the like, through any combination of intervening private or public networks. Illustrative network adapters include, but are not limited to, modems, cable modems, and Ethernet cards. System memory can include computer system readable media in the form of volatile memory, such as random access memory (RAM) and/or cache memory. A computer system/server may further include other removable/non-removable, volatile/non-volatile computer system storage media. By way of example only, a storage system can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM, or other optical media can be provided. In such instances, each can be connected to bus by one or more data media interfaces. As will be further depicted and described below, memory may include at least one program product having a set (e.g., at least one) of program modules that are configured to carry out the functions of embodiments of the invention.

It should be understood that the present invention can be realized in hardware, software, a propagated signal, or any combination thereof. Any kind of computer/server system (s)—or other apparatus adapted for carrying out the methods described herein—is suited. A typical combination of hardware and software could be a general purpose computer system with a computer program that, when loaded and executed, carries out the respective methods described herein. Alternatively, a specific use computer, containing specialized hardware for carrying out one or more of the functional tasks of the invention, could be utilized. The present invention can also be embedded in a computer program product or a propagated signal, which comprises all the respective features enabling the implementation of the methods described herein, and which—when loaded in a computer system—is able to carry out these methods. Computer program, propagated signal, software program, program, or software, in the present context mean any expression, in any language, code or notation, of a set of instructions intended to cause a system having an information processing capability to perform a particular function either directly or after either or both of the following: (a) conversion to another language, code, or notation; and/or (b) reproduction in a different material form.

As indicated, the embodiments of the invention may be implemented as a computer readable signal medium, which may include a propagated data signal with computer readable program code embodied therein (e.g., in baseband or as part of a carrier wave). Such propagated signal may take any of a variety of forms including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium including, but not limited to, wireless, wireline, optical fiber cable, radio-frequency (RF), etc., or any suitable combination of the foregoing.

The foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. A semiconductor sensor reliability system, comprising:
    a semiconductor system comprising a plurality of functional blocks;
    a plurality of sensors comprising a set of age-detecting sensors and at least one gradient-detecting sensor;
        wherein the set of age-detecting sensors is positioned on the plurality of functional blocks, wherein each of the plurality of functional blocks has at least one age-detecting sensor of the set of age-detecting sensors, and wherein each of the plurality of age-detecting sensors detects an aging of its respective functional block;
        wherein the at least one gradient-detecting sensor is positioned between two functional blocks of the plurality of functional blocks, wherein the at least one gradient-detecting sensor detects a gradient between the two functional blocks of the plurality of functional blocks; and
    a sensor control component for controlling the plurality of sensors based on an output received from the plurality of sensors.

2. The semiconductor sensor reliability system of claim 1, wherein the at least one age-detecting sensor is positioned at a location within its respective functional block based on estimated physical effects inherent within a manufacturing process of the semiconductor system.

3. The semiconductor sensor reliability system of claim 1, wherein the at least one gradient-detecting sensor positioned between the two functional blocks of the plurality of functional blocks is imbedded at a connection point between the two functional blocks.

4. The semiconductor sensor reliability system of claim 1, each of the plurality of sensors having a mode selection input for selecting a mode of the plurality of sensors and an operational trigger input for enabling the plurality of sensors to detect the aging.

5. The semiconductor sensor reliability system of claim 4, the mode selection input enabling the plurality of sensors to have:
    an operational mode in which the plurality of sensors are subject to an aging process; and
    a measurement mode in which an age of the plurality of sensors is outputted.

6. The semiconductor sensor reliability system of claim 1, each of the plurality of sensors comprising a plurality of sensor stages connected as a network and a self digitizer.

7. The semiconductor sensor reliability system of claim 1, wherein the sensor control component further controls at least one of the following: at least one of the plurality of functional blocks, and the semiconductor system.

8. The semiconductor sensor reliability system of claim 3, wherein each age-detecting sensor of the set of age-detecting sensors is configured to have performance characteristics matching its respective functional block on which it is positioned, and the at least one gradient-detecting sensor is configured to have performance characteristics matching the connection point.

* * * * *